(12) United States Patent (10) Patent No.: US 9,023,713 B2
Illgen et al. (45) Date of Patent: May 5, 2015

(54) ULTRATHIN BODY FULLY DEPLETED SILICON-ON-INSULATOR INTEGRATED CIRCUITS AND METHODS FOR FABRICATING SAME

(75) Inventors: Ralf Illgen, Dresden (DE); Stefan Flachowsky, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 265 days.

(21) Appl. No.: 13/530,449

(22) Filed: Jun. 22, 2012

(65) Prior Publication Data

US 2013/0341722 A1 Dec. 26, 2013

(51) Int. Cl.
*H01L 21/00* (2006.01)
*H01L 21/324* (2006.01)
*H01L 21/762* (2006.01)
*H01L 21/84* (2006.01)
*H01L 27/12* (2006.01)
*H01L 29/165* (2006.01)
*H01L 29/66* (2006.01)
*H01L 29/78* (2006.01)
*H01L 29/786* (2006.01)
*H01L 29/51* (2006.01)

(52) U.S. Cl.
CPC .......... *H01L 29/7848* (2013.01); *H01L 21/324* (2013.01); *H01L 21/76283* (2013.01); *H01L 21/84* (2013.01); *H01L 27/1203* (2013.01); *H01L 29/165* (2013.01); *H01L 29/51* (2013.01); *H01L 29/6653* (2013.01); *H01L 29/66553* (2013.01); *H01L 29/66628* (2013.01); *H01L 29/7834* (2013.01); *H01L 29/7843* (2013.01); *H01L 29/78696* (2013.01)

(58) Field of Classification Search
USPC .......................................... 438/400, 151, 199
See application file for complete search history.

(56) References Cited

U.S. PATENT DOCUMENTS

2012/0146142 A1* 6/2012 Zhu et al. ...................... 257/347

* cited by examiner

*Primary Examiner* — Laura Menz
(74) *Attorney, Agent, or Firm* — Ingrassia Fisher & Lorenz, P.C.

(57) ABSTRACT

Integrated circuits and methods for fabricating integrated circuits are provided. In an embodiment, a method for fabricating an integrated circuit includes providing an ultrathin body (UTB) fully depleted silicon-on-insulator (FDSOI) substrate. A PFET temporary gate structure and an NFET temporary gate structure are formed on the substrate. The method implants ions to form lightly doped active areas around the gate structures. A diffusionless annealing process is performed on the active areas. Further, a compressive strain region is formed around the PFET gate structure and a tensile strain region is formed around the NFET gate structure.

17 Claims, 13 Drawing Sheets

ULTRATHIN BODY FULLY DEPLETED SILICON-ON-INSULATOR INTEGRATED CIRCUITS AND METHODS FOR FABRICATING SAME

TECHNICAL FIELD

The present disclosure generally relates to integrated circuits and methods for fabricating integrated circuits, and more particularly relates to integrated circuits formed from ultrathin body fully depleted silicon-on-insulator substrates and methods for fabricating integrated circuits from ultrathin body fully depleted silicon-on-insulator substrates.

BACKGROUND

Generally, integrated circuits comprise electronic components, such as transistors, capacitors, and the like, formed on and within a wafer. The trend in the semiconductor industry is towards the miniaturization or scaling of integrated circuits, in order to provide smaller integrated circuits and improved performance, such as increased speed and decreased power consumption. Integrated circuits formed from ultrathin body (UTB) fully depleted silicon-on-insulator (FDSOI) substrates exhibit improved performance due to undoped channels and excellent electrostatic control. Further, the use of UTB FDSOI substrates leads to very high drive currents and good off-state leakage, ideal subthreshold slope, and small drain-induced barrier lowering (DIBL) in devices as short as 20 nm.

While UTB FDSOI substrates have been identified as providing improved performance, the introduction of new materials and new processing schemes is necessary to continue improvement of performance as device size decreases. Accordingly, it is desirable to provide integrated circuits formed from ultrathin body fully depleted silicon-on-insulator substrates that achieve such improvement of performance and methods for fabricating such integrated circuits using new materials and new processing schemes. In addition, it is desirable to provide integrated circuits and methods for fabricating integrated circuits which include both compressive strain regions and tensile strain regions to improve channel mobility. Also, it is desirable to provide methods for fabricating integrated circuits which utilize diffusionless annealing. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, a method for fabricating an integrated circuit includes providing an ultrathin body fully depleted silicon-on-insulator substrate. A PFET temporary gate structure and an NFET temporary gate structure are formed on the substrate. The method implants ions to form lightly doped active areas around the gate structures. A diffusionless annealing process is performed on the active areas. Further, a compressive strain region is formed around the PFET gate structure and a tensile strain region is formed around the NFET gate structure.

In another embodiment, a method for fabricating an integrated circuit is provided and includes providing an ultrathin body fully depleted silicon-on-insulator substrate and forming a PFET temporary gate structure and an NFET temporary gate structure on the substrate. A compressive strain region is formed around the PFET temporary gate structure and a tensile strain region is formed around the NFET temporary gate structure. Then, the PFET temporary gate structure and the NFET temporary gate structure are replaced with high K metal gate (HKMG) structures.

In accordance with another embodiment, an integrated circuit includes an ultrathin body fully depleted silicon-on-insulator substrate. The integrated circuit also includes a PFET high K metal gate structure and an NFET high K metal gate structure formed on the substrate. Further, a silicon germanium compressive strain region is formed around the PFET high K metal gate structure, and a silicon carbon tensile strain region formed around the NFET high K metal gate structure.

BRIEF DESCRIPTION OF THE DRAWINGS

Embodiments of the integrated circuits and methods for fabricating integrated circuits will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits are formed with ultrathin body (UTB) fully depleted silicon-on-insulator (FDSOI) substrates and exhibit improved performance due to undoped channels and excellent electrostatic control. Further, the use of UTB FDSOI substrates leads to very high drive currents and good off-state leakage, ideal subthreshold slope, and small drain-induced barrier lowering (DIBL) in devices as short as 20 nm. The integrated circuits are formed with compressive strain regions, such as in situ boron-doped (ISBD) silicon germanium (SiGe) regions, and tensile strain regions, such as in situ phosphorus-doped (ISPD) silicon carbon (SiC) regions. Also, the integrated circuits include high K metal gate (HKMG) structures.

The integrated circuits fabricated according to the methods herein exhibit superior short channel behavior, as well as a greatly reduced random dopant fluctuation due to the combination of the UTB FDSOI device, the HKMG structures, and diffusionless annealing processes utilized in the method. The superior short channel behavior allows for further scaling of gate length and a reduction of lateral device dimensions, which is important for high packing density.

Due to the use of diffusionless annealing in the methods described herein, ISPD SiC can be utilized to provide for tensile stressing of NFET regions. As a result, higher electron mobility in the NFET channel region is achieved. Further, by using in situ boron doping, the SiGe compressive strain regions can include a higher germanium content, thereby increasing the strain and increasing hole mobility in the PFET channel region. As a result of the non-equilibrium growth conditions of the ISBD and ISPD epitaxy, the boron and phosphorus content can be much higher than for ion implantation, which reduces sheet resistance of the extension as well as of the source/drain areas.

Further, due to the in situ doping process, deep source/drain implantations for the NFET and PFET regions are not necessary. Therefore, the formation of stacking faults for both transistor types is minimized compared to ion implantation methods. As a result, a possible relaxation of the SiGe and SiC layers can be avoided, and a higher stress can be transferred from the strain regions to the channels, leading to higher drive currents.

Figure 1:
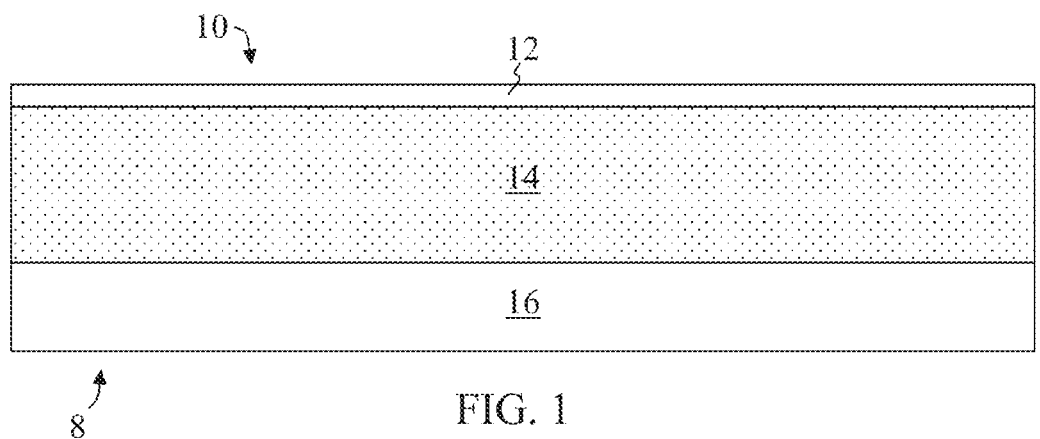
FIGS. 1-25 illustrate, in cross section, a portion of an integrated circuit and method steps for fabricating an integrated circuit in accordance with various embodiments herein.
Figure 2:
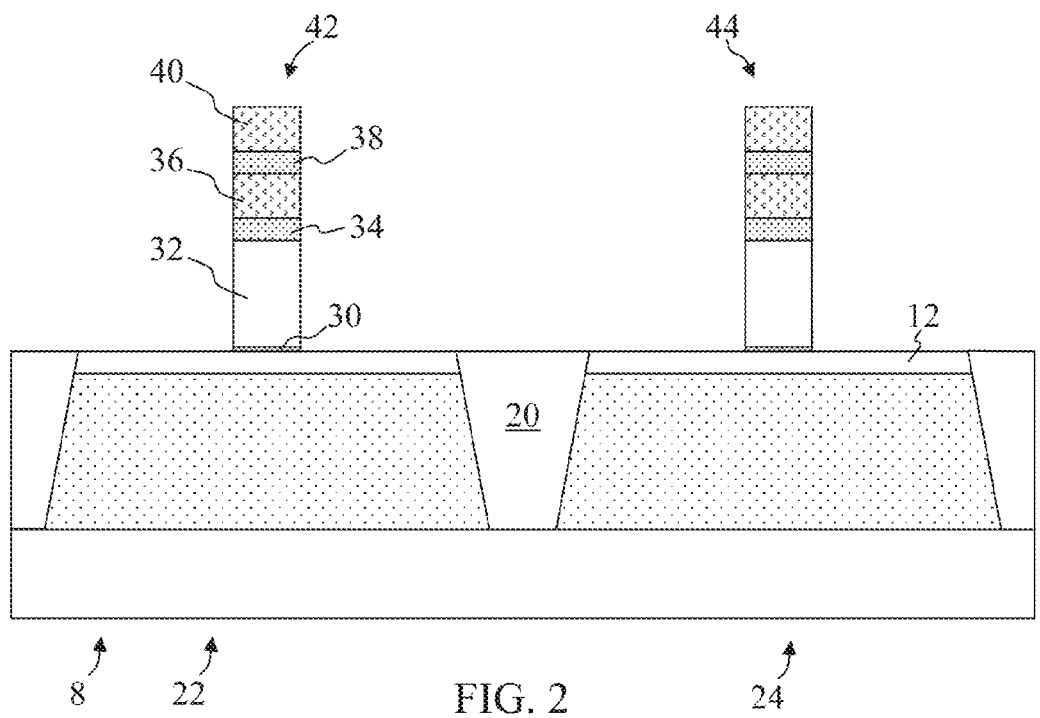

Turning now to FIG. 1, in an exemplary embodiment, the process of fabricating an integrated circuit 8 begins by providing a semiconductor substrate 10, such as an ultrathin body (UTB) silicon-on-insulator (SOI) wafer with an undoped SOI layer 12 having a thickness of about 5 nanometers (nm) overlying a buried oxide layer 14 and a semiconductor layer 16. Using conventional processing, shallow trench isolation (STI) regions 20 are formed in the substrate 10 as shown in FIG. 2 and define an NFET region 22 and a PFET region 24. A temporary gate oxide layer 30, temporary polysilicon layer 32, an oxide ($SiO_2$) liner 34, a nitride ($Si_3N_4$) cap 36, an oxide ($SiO_2$) liner 38, and a nitride ($Si_3N_4$) cap 40 are then deposited and etched to form an NFET gate structure 42 and a PFET gate structure 44. Optionally, the polysilicon of polysilicon layer 32 and the SOI layer 12 can be reoxidized after formation of the gate structures 42, 44.

Figure 3:
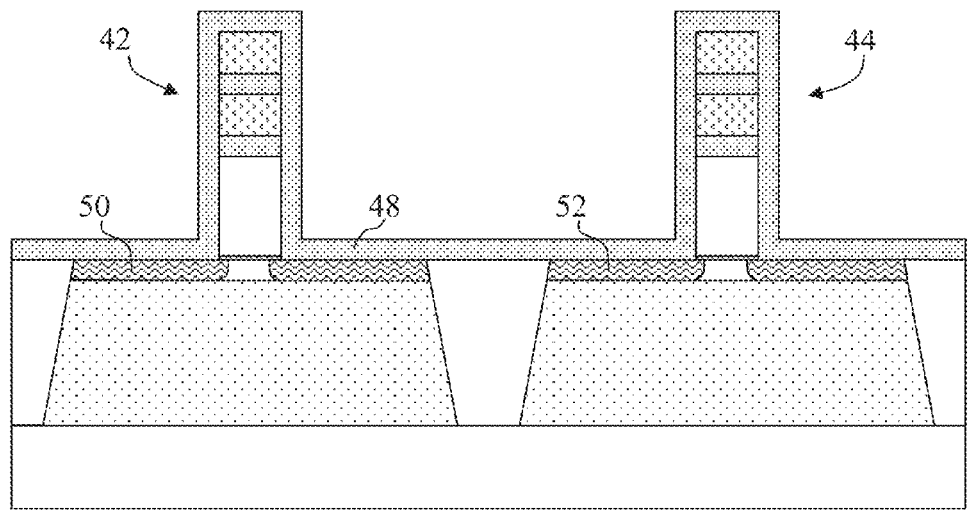

In FIG. 3, an oxide ($SiO_2$) liner 48 is deposited over the SOI layer 12 and the gate structures 42, 44. Then, conventional mask/implantation processes are performed to implant ions to form lightly doped source/drain extension implants around the NFET gate structure 42 and the PFET gate structure 44, respectively. An ultra fast anneal (UFA) process, such as a laser spike anneal (LSA) or flash lamp anneal (FLA) process is performed to activate the implants to form active areas 50, 52 while minimizing implant damage. In an exemplary embodiment, the UFA process is performed in a temperature range of about 1200° C. to about 1300° C. and for a duration of about 1 microsecond (ms) to about 10 ms. The anneal process is diffusionless. As used herein, a "diffusionless" process exhibits no to very little diffusion, i.e., no more than 5 nm outdiffusion from an implanted profile, such as less than 4 nm outdiffusion, for example less than 3 nm outdiffusion. Typical rapid thermal anneal (RTA) processes exhibit outdiffusion of more than about 20 nm.

Figure 4:
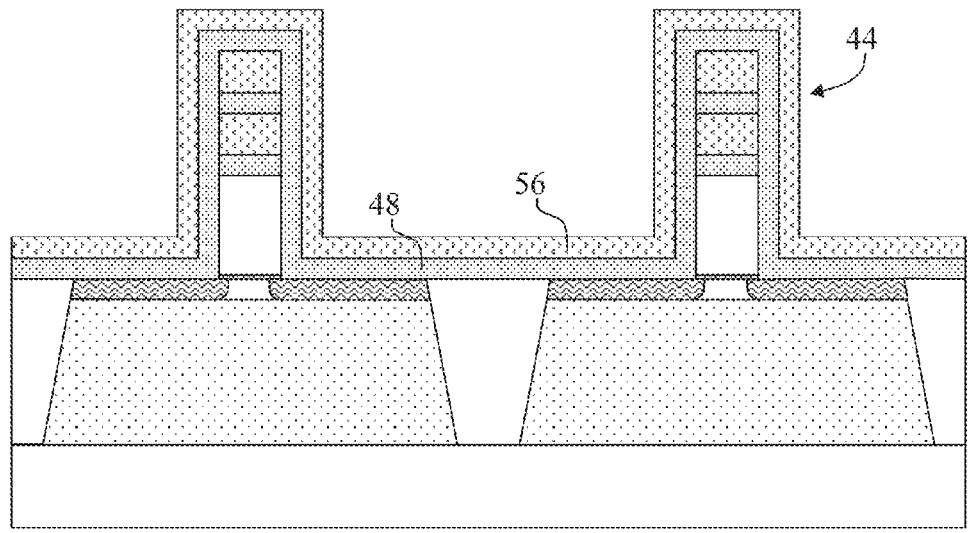
Figure 5:
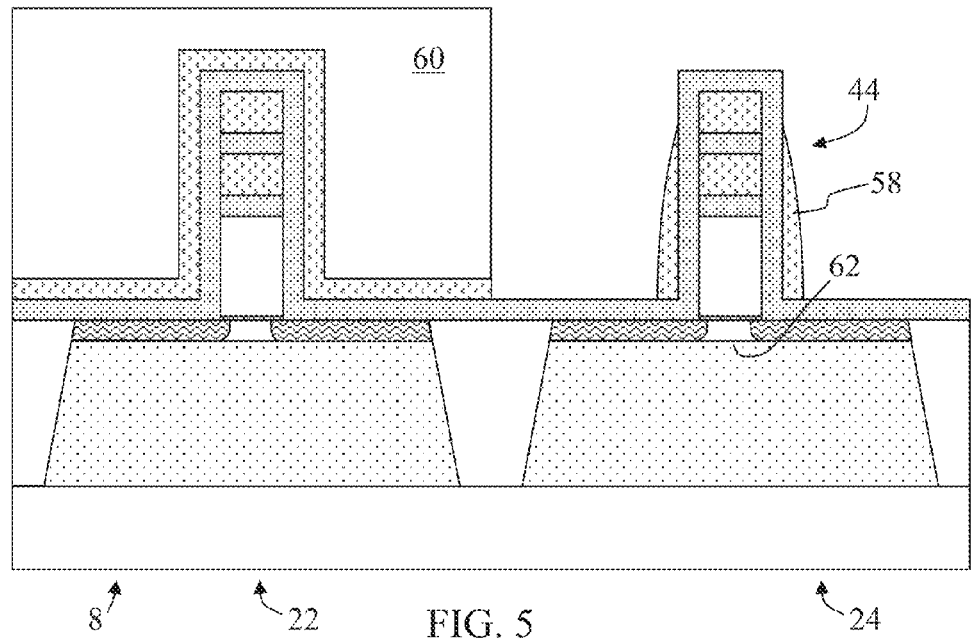
Figure 6:
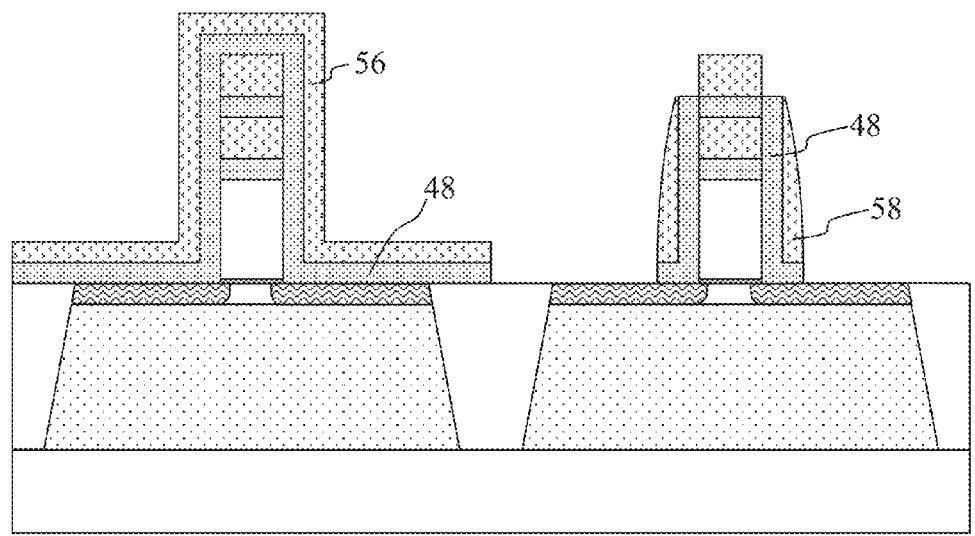

After the anneal, a process is commenced for compressively straining the PFET gate structure 44. In FIG. 4, a nitride layer 56 is deposited over the oxide liner 48. Then, a lithography mask 60 is formed over the NFET region 22, as shown in FIG. 5. In the PFET region 24, the nitride layer 56 is anisotropically etched to form a spacer 58. The spacer 58 defines the proximity of compressive strain regions relative to the channel 62 below the PFET gate structure 44. The lithography mask 60 is then removed and a pre-clean process is performed to remove oxide, specifically the exposed portions of oxide liner 48, i.e., the portions not covered by the nitride layer 56 or spacer 58, as shown in FIG. 6.

Figure 7:
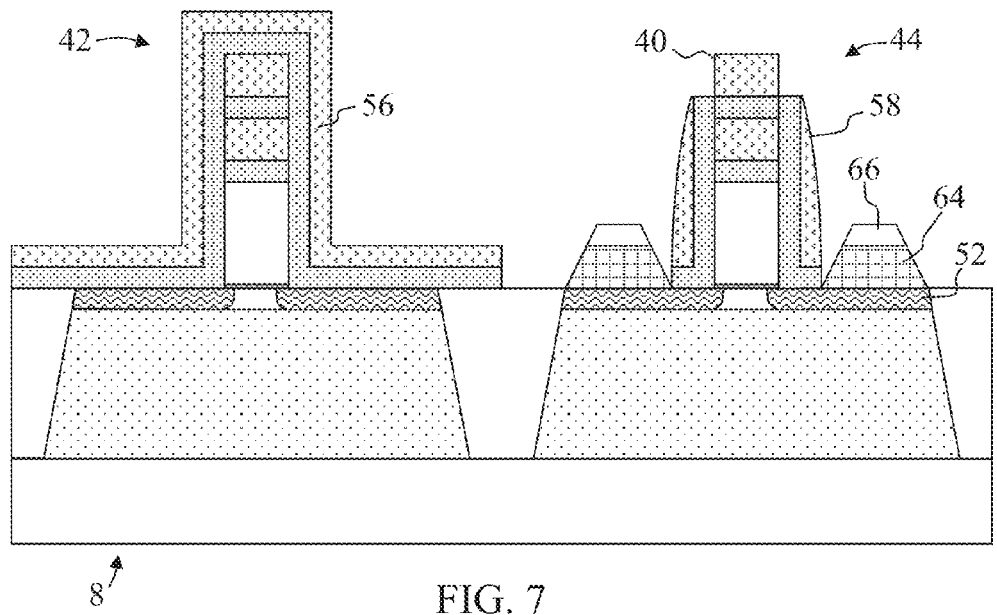
Figure 8:
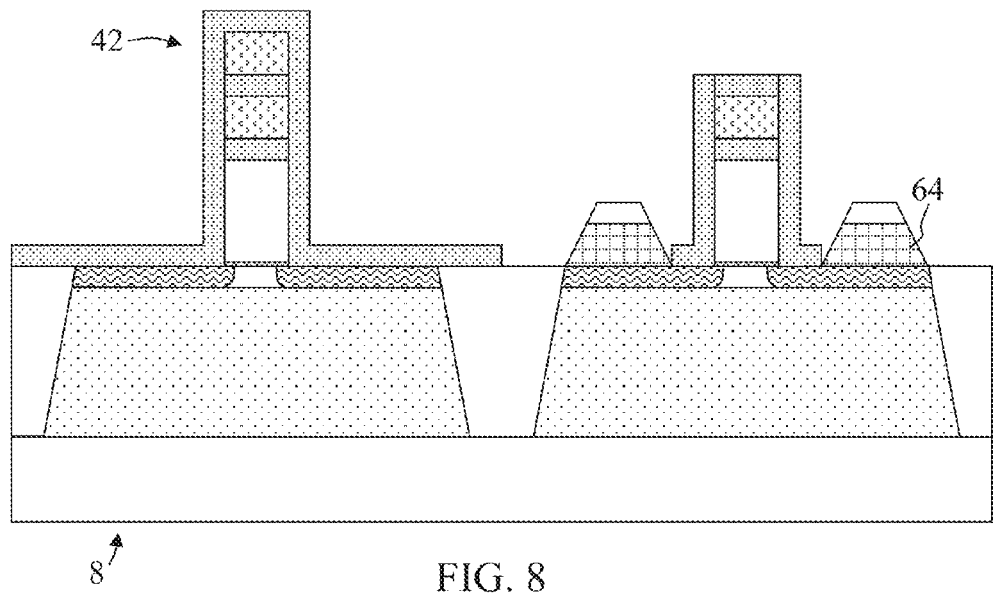

In FIG. 7, raised compressive strain regions 64 are formed around the PFET gate structure 44. In an exemplary embodiment, the regions 64 are formed by in situ boron doped (ISBD) silicon germanium (SiGe). Specifically, a boron-doped SiGe layer is grown by a process of selective epitaxial growth on the active area 52 with, for example, a germanium content of about 20% to about 30% and a boron concentration of about 1e20 to about 5e20 ions/cm$^3$ to form the compressive strain regions 64. As shown, the compressive strain regions 64 are formed with epitaxial facets to reduce parasitic capacitance. Highly boron-doped germanium-free silicon layers 66 are grown over the regions 64 with, for example, a boron concentration of about 1e20 to about 5e20 ions/cm$^3$. Then the nitride cap 40, nitride spacer 58 and nitride layer 56 are removed, such as by hot phosphorus etching, resulting in the structure shown in FIG. 8.

Figure 9:
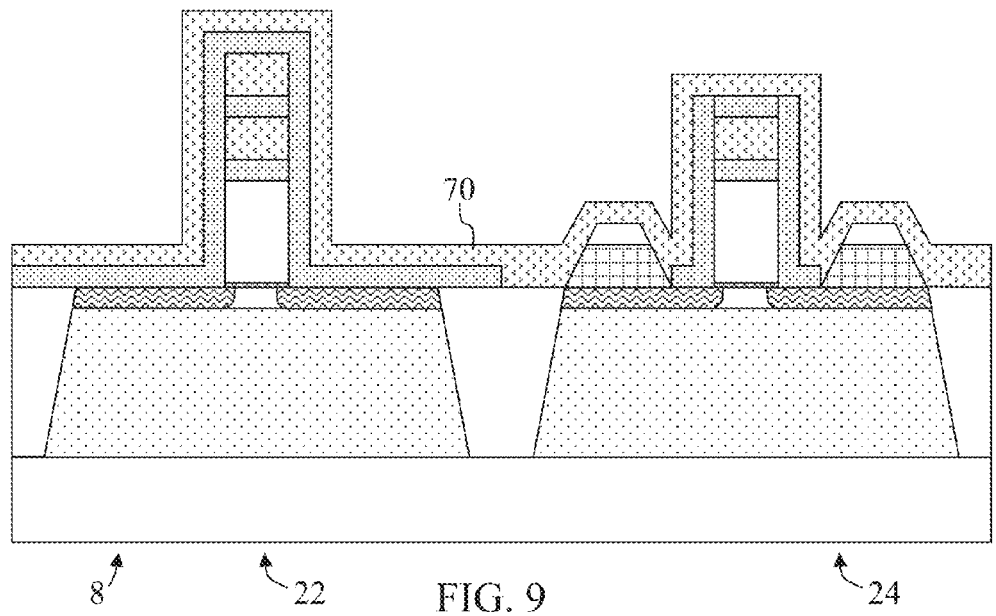
Figure 10:
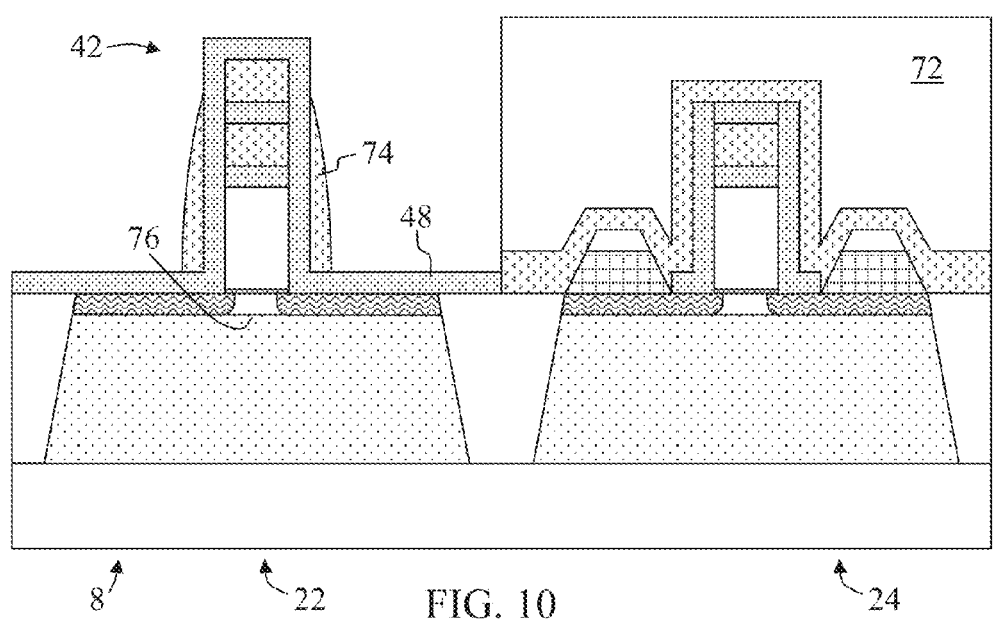
Figure 11:
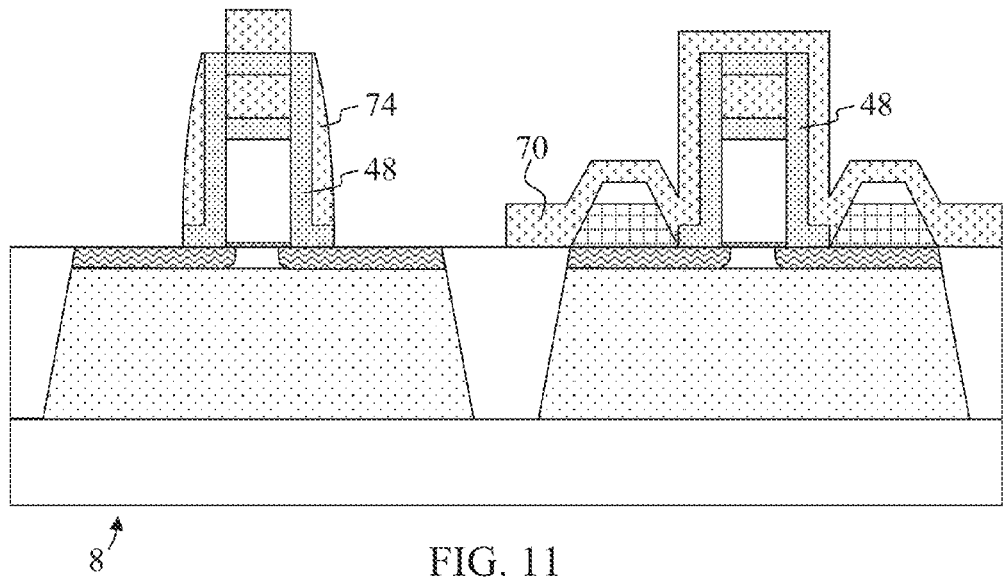

With the compressive strain regions 64 formed, the process moves on to tensile straining the NFET gate structure 42. As shown in FIG. 9, a nitride layer 70 is deposited over the NFET region 22 and PFET region 24. Then, a lithography mask 72 is formed over the PFET region 24, as shown in FIG. 10. In the NFET region 22, the nitride layer 70 is anisotropically etched to form a spacer 74. The spacer 74 is used to define the proximity of tensile strain regions relative to the channel 76 below the NFET gate structure 42. The lithography mask 72 is then removed and a pre-clean process is performed to remove oxide, specifically the exposed portions of oxide liner 48, i.e., the portions not covered by the nitride layer 70 or spacer 74, as shown in FIG. 11

Figure 12:
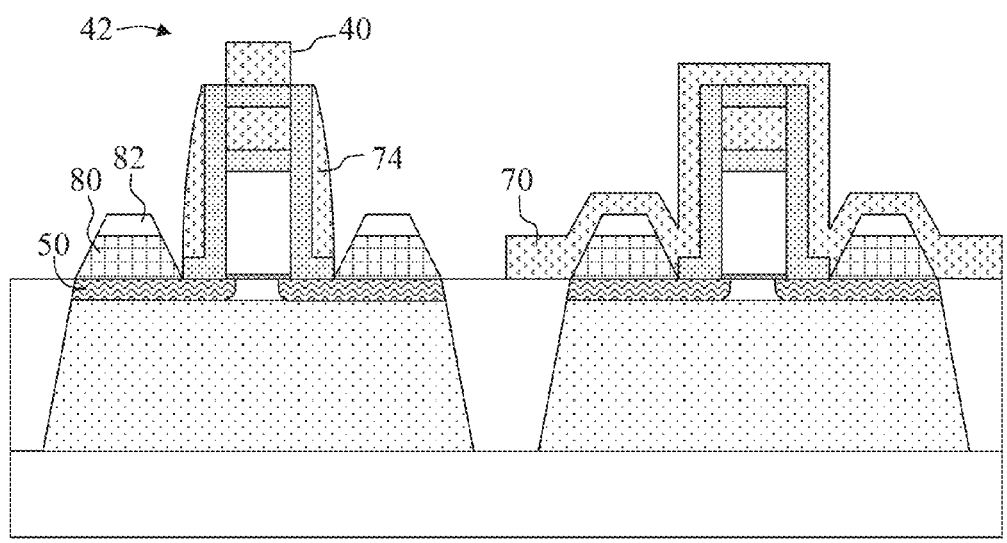
Figure 13:
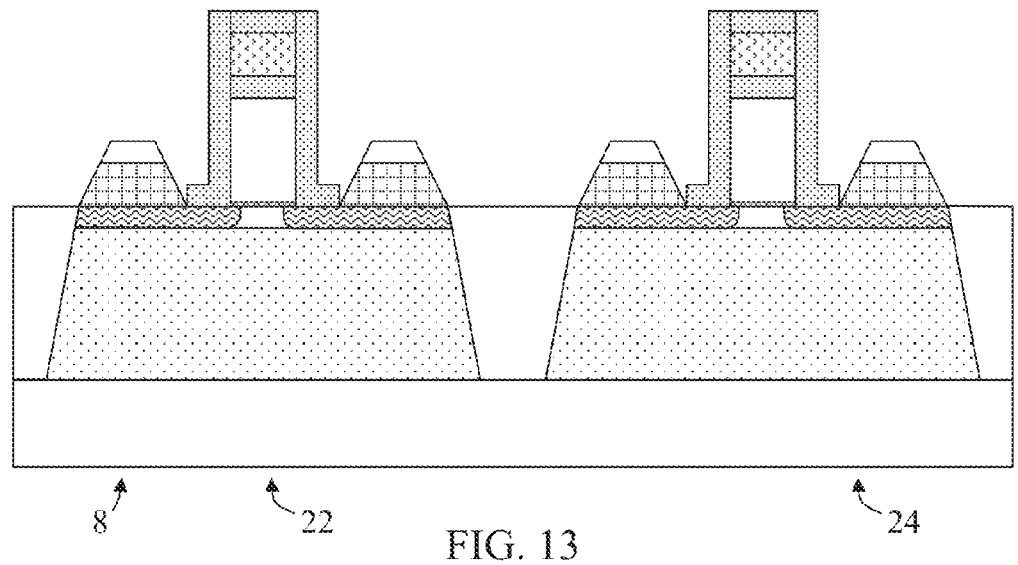

In FIG. 12, raised tensile strain regions 80 are formed around the NFET gate structure 42. In an exemplary embodiment, the regions 80 are formed by in situ phosphorus doped (ISPD) silicon carbon (SiC). Specifically, a highly phosphorus-doped SiC layer is grown on the active area 50 with, for example, a carbon content of about 1% to about 3% and a phosphorus concentration of about 2e20 to about 6e20 ions/cm$^3$ to form the regions 80. The tensile strain regions 80 are formed with epitaxial facets to reduce parasitic capacitance. Highly phosphorus-doped carbon-free silicon layers 82 are grown over the regions 80 with, for example, a phosphorus concentration of about 2e20 to about 6e20 ions/cm$^3$. After forming the tensile strain regions 80, the nitride cap 40, nitride spacer 74 and nitride layer 70 are removed, such as by hot phosphorus etching, resulting in the structure shown in FIG. 13, with symmetric NFET and PFET regions 22, 24.

Figure 14:
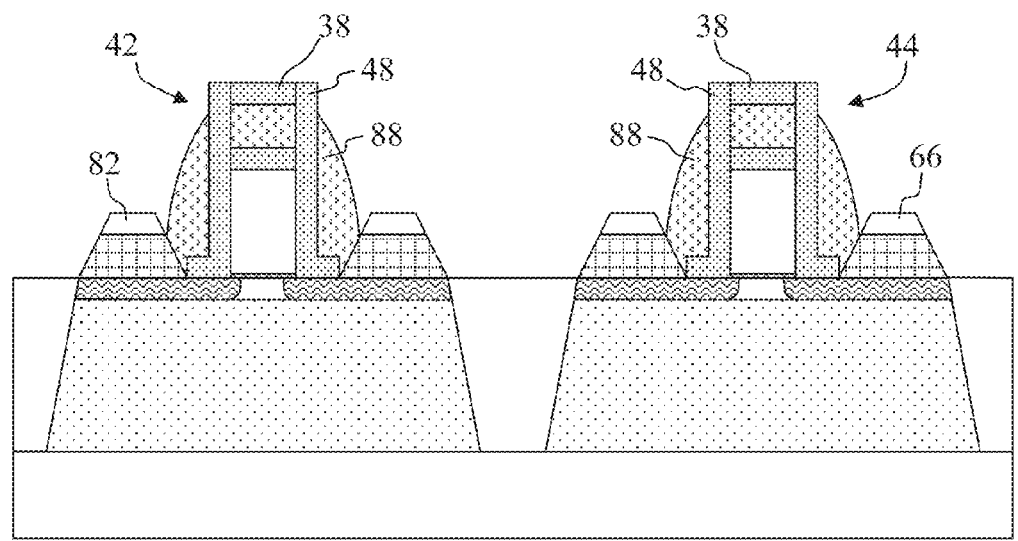
Figure 15:
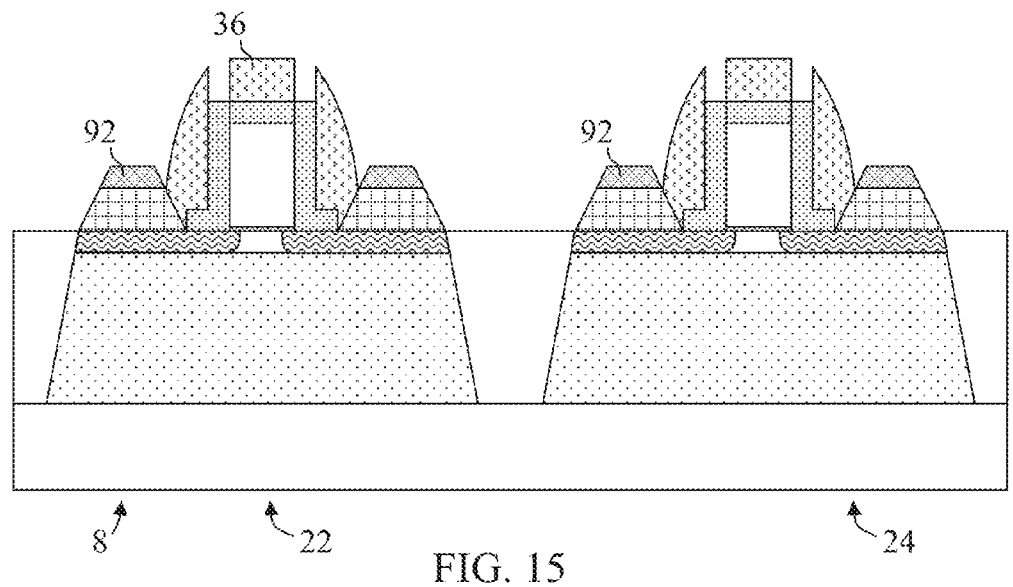

In FIG. 14, spacers 88 have been formed around gate structures 42, 44, such as by typical nitride deposition and etching steps. Then an ultrafast annealing (UFA) process, such as laser spike annealing (LSA) is performed to activate the dopants in the extension and deep source/drain areas. The deep source/drain areas are formed "in-situ" with the epitaxial growth of SiGe:B for PFET (region 64) and SiC:P for NFET (region 80). The purpose of the LSA at this step is more or less only to activate the already present dopants (extension region and in-situ doped epitaxial grown deep source/drain areas) above the equilibrium solubility limit since the peak temperature of the LSA is extreme high (>1250° C. compared to ~1050° C. with rapid thermal anneal (RTA) As shown in FIG. 15, the oxide liner 38 and the exposed portion of the oxide liner 48 are removed in a pre-clean process to expose the nitride cap 36 in regions 22, 24. Then a metal layer, such as nickel or platinum, is deposited on and reacts with the silicon layers 66, 82 to form silicide contacts 92.

Figure 16:
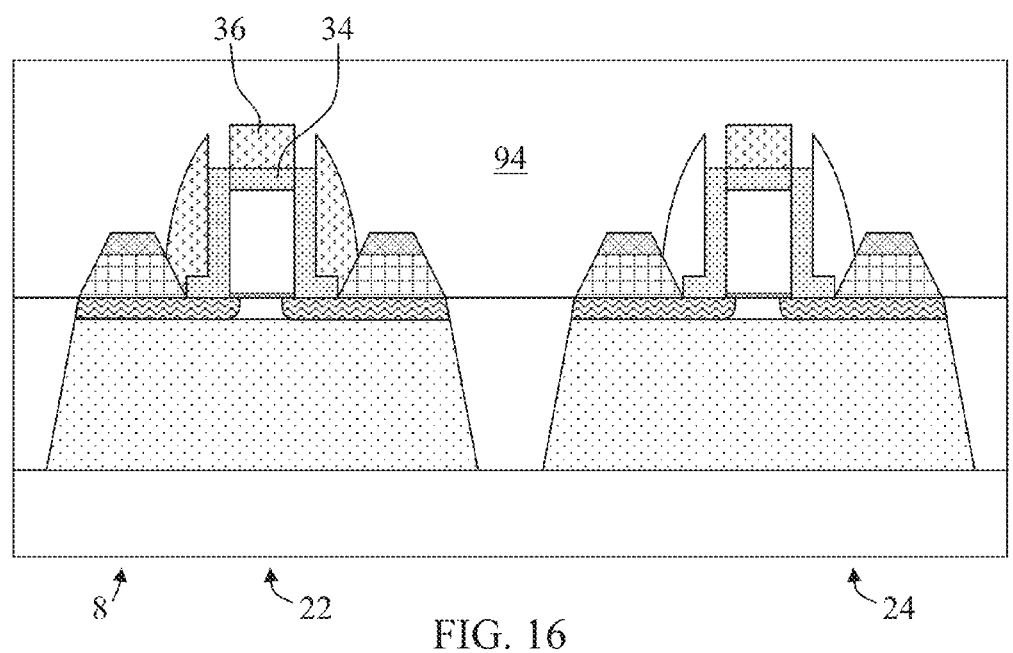
Figure 17:
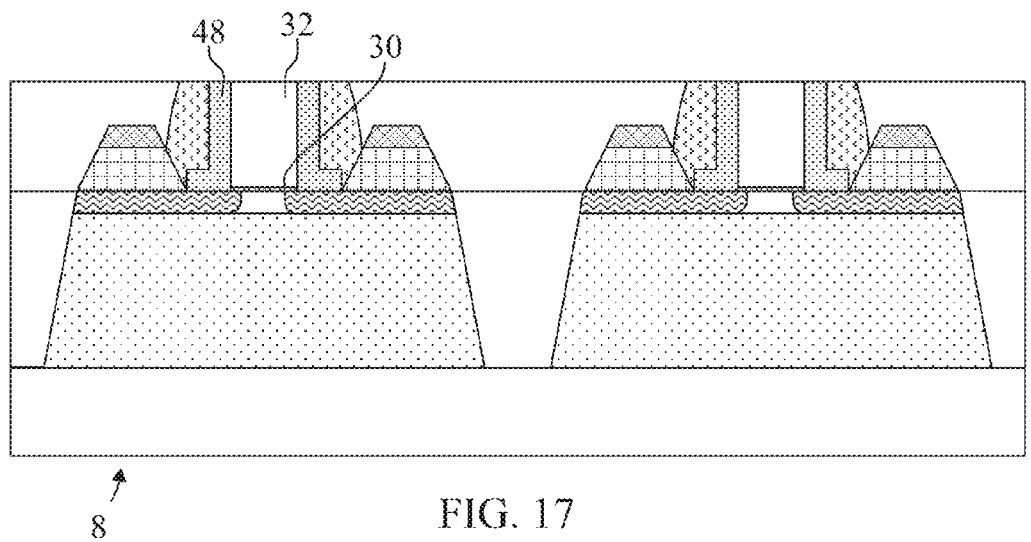
Figure 18:
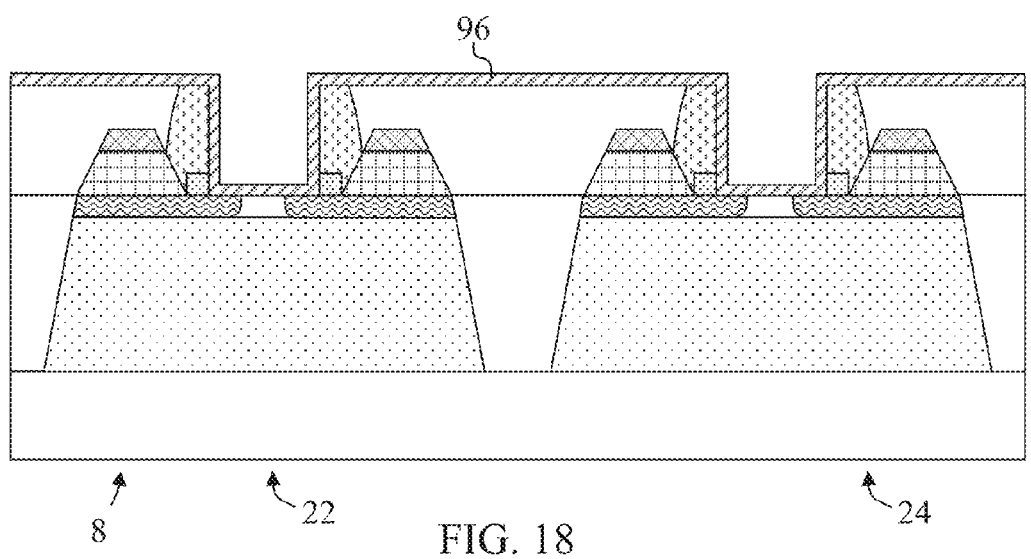

With the silicide contacts 92 formed over the active areas 50, 52, processing continues in FIG. 16 by depositing an interlayer material 94, such as tetraethyl orthosilicate (TEOS) oxide, over the NFET and PFET regions 22, 24. Then the interlayer material 94 is polished, such as by chemical mechanical planarization (CMP), back down to the polysilicon layer 32. As shown in FIG. 17, the nitride cap 36 and oxide liner 34 are removed during the CMP process. In FIG. 18, the polysilicon layer 32, the gate oxide layer 30, and vertical portions of oxide liner 48 are removed and will be replaced by a high K metal gate structure as described below. By replacing the polysilicon gate structures with high K metal gate structures, local stress from the strain regions is increased by up to 50% due to the elimination of repulsive forces from the temporary polysilicon 32. Further, high K metal gate structures suppress gate oxide leakages and improve short channel control by reducing the effective electrical gate oxide thickness.

Figure 19:
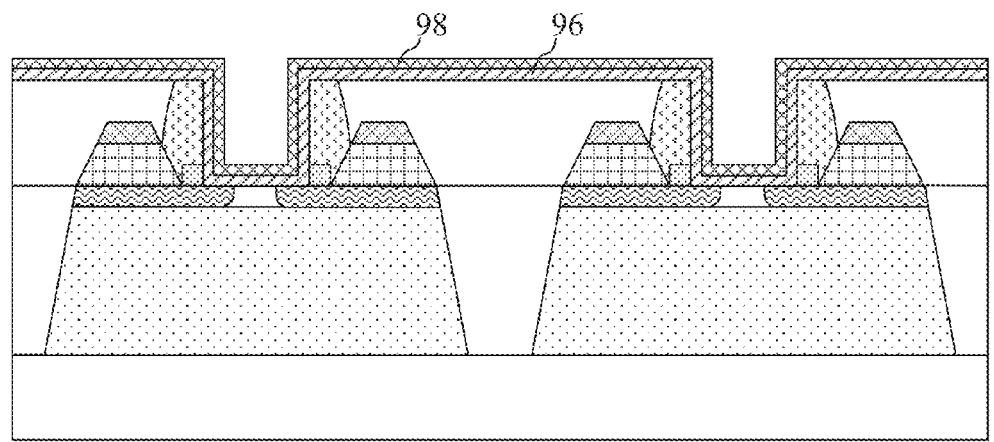
Figure 20:
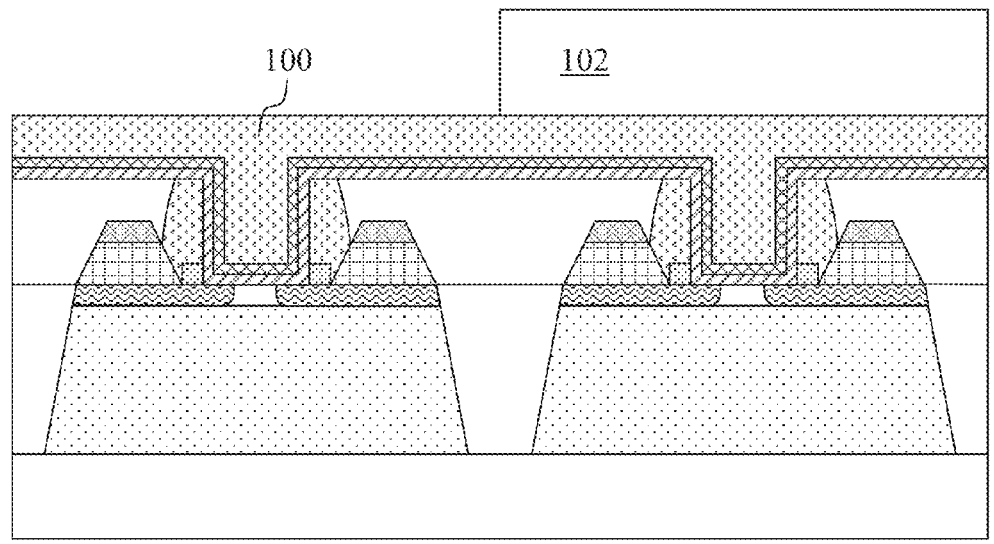

To form the HKMG structures, a high-k dielectric 96, such as Hf-based or Zr-based oxide, is deposited across the NFET and PFET regions 22, 24. In FIG. 19, a p-metal work function layer 98 is sputtered over the high-k dielectric 96. A nitride hard mask 100 is then formed over layer 98, and a mask 102 is formed over the hard mask 100 in the PFET region 24 as shown in FIG. 20.

Figure 21:
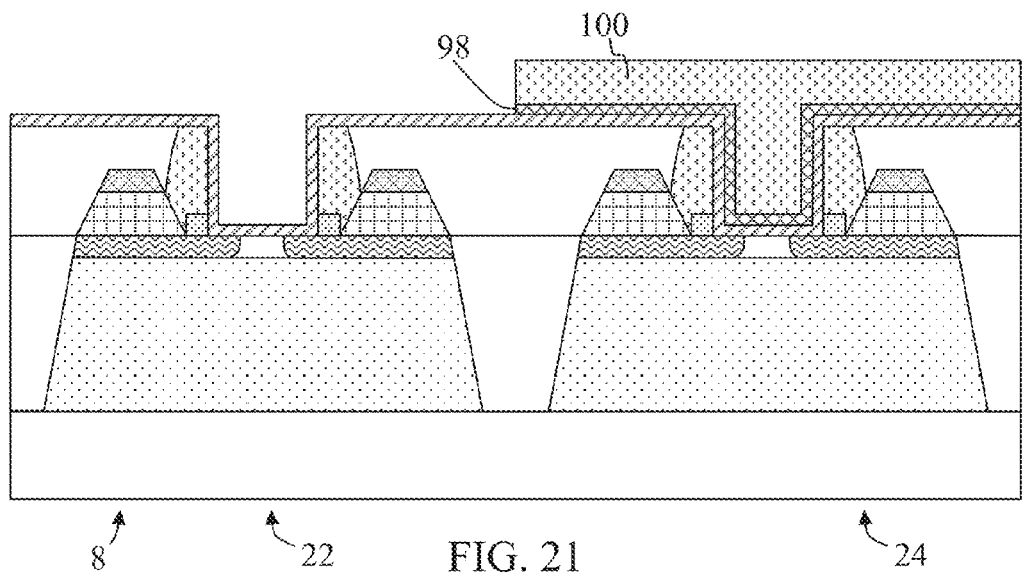
Figure 22:
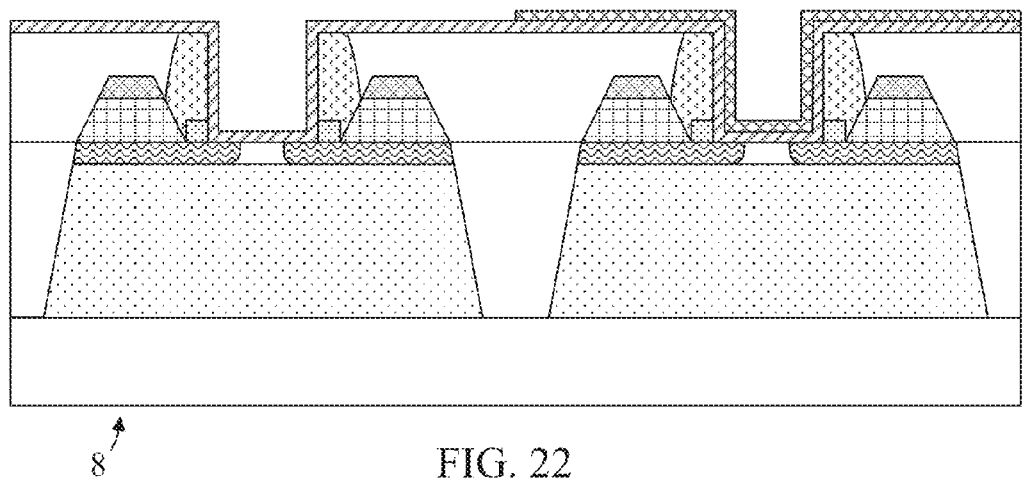
Figure 23:
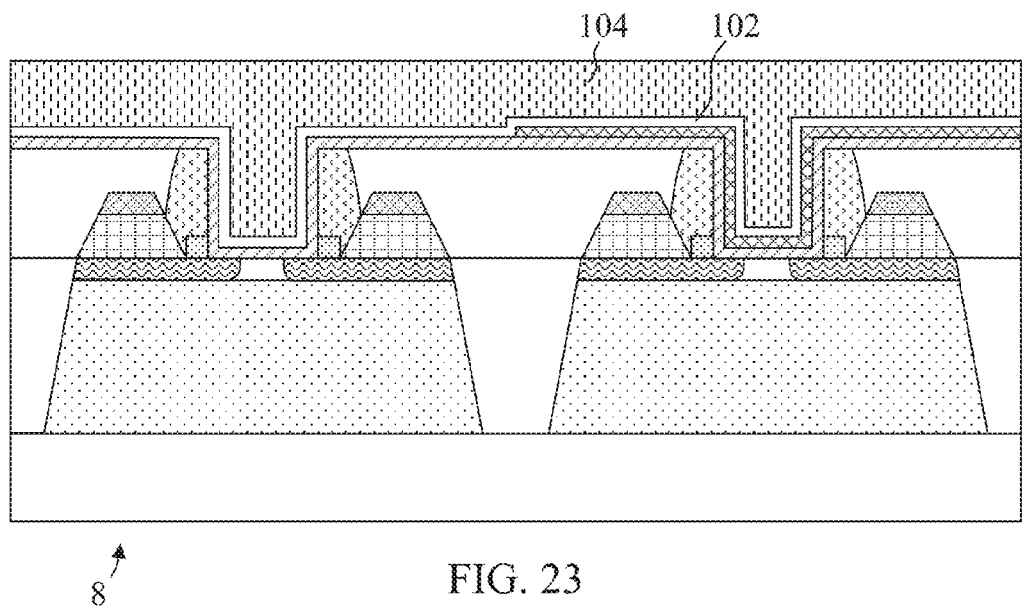

In FIG. 21, the nitride hard mask 100 and p-metal work function layer 98 are etched from the NFET region 22, before the mask 102 is removed from the PFET region 24. The nitride hard mask 100 is removed from the PFET region 24 in FIG. 22. Then, an n-metal work function layer 102 is sputtered over the NFET and PFET regions 22, 24 and a metal fill 104 is deposited as shown in FIG. 23.

Figure 24:
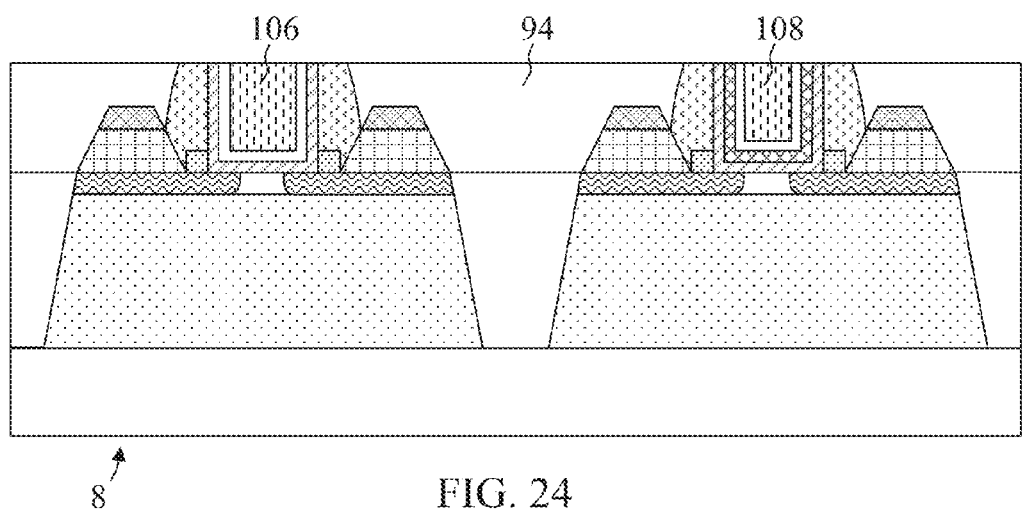
Figure 25:
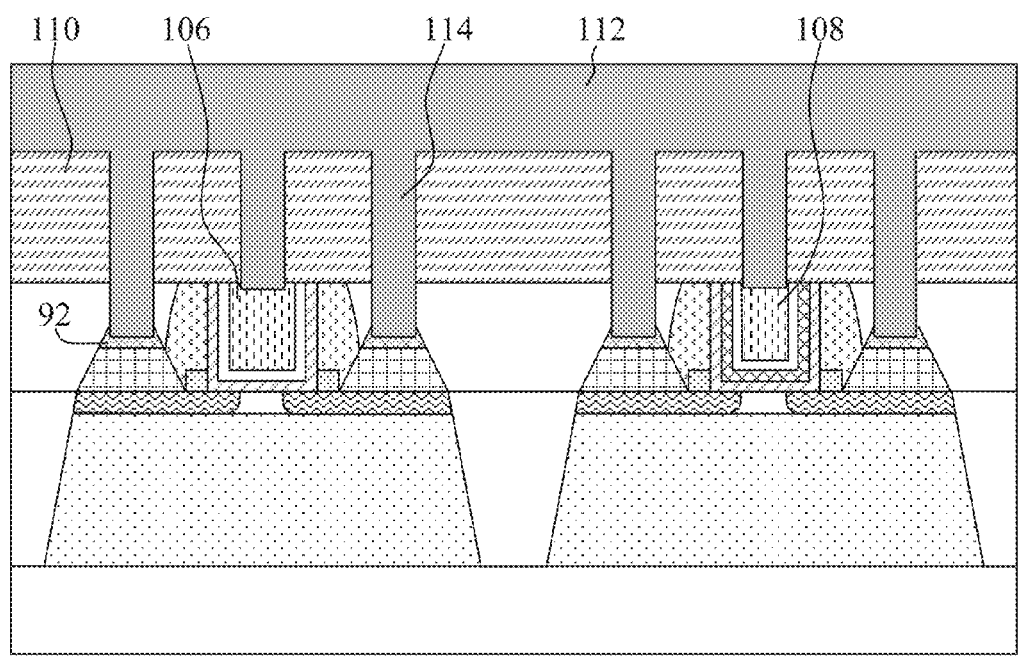

Another polishing step is performed down to the interlayer material 94 and results in exposing high K metal gate (HKMG) structures 106, 108 shown in FIG. 24. In FIG. 25, additional interlayer material 110, such as TEOS, is deposited as an isolator for further contacts. Then contact holes are formed in the interlayer materials 94, 110 over the silicide contacts 92 and metal gate structures 106, 108. A metal layer 112, such as tungsten, is deposited and fills the contact holes to form vias 114 providing electrical contact with the silicide contacts 92 and metal gate structures 106, 108. Further back-end-of-line (BEOL) processing may then occur to finalize the desired integrated circuit 8.

To briefly summarize, the fabrication methods described herein result in integrated circuits 8 with improved performance. Specifically, the integrated circuit fabrication methods herein provide for the formation of compressive strain regions and tensile strain regions through selective epitaxial growth of SiGe and SiC in a UTB FDSOI device, utilize diffusionless annealing processes characterized by minimum lateral diffusion and high dopant activation, and high K metal replacement gate structures. As a result, the fabricated integrated circuits 8 exhibit superior short channel behavior, as well as greatly reduced random dopant fluctuation. This permits further scaling of gate length and a reduction of lateral device dimensions—an important feature for high packing density. Also, the implementation of the NFET tensile strain regions provides for higher electron mobility in the NFET channel region. The diffusionless annealing process allows integration of the meta-stable SiC layer as the tensile strain region. Further, the use of ISBD SiGe to form the compressive strain regions allows for incorporated a higher germanium content substitutionally into the SiGe layer, thereby increasing the compressive strain and leading to higher hole mobility in the PFET channel region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
    providing an ultrathin body fully depleted silicon-on-insulator substrate;
    forming a PFET temporary gate structure and an NFET temporary gate structure on the substrate;
    implanting ions to form lightly doped active areas around the gate structures;
    performing a diffusionless annealing process on the active areas;
    forming a compressive strain region around the PFET gate structure by growing a boron-doped silicon germanium (SiGe) layer having a germanium content of about 20% to about 30% and a boron concentration of about 1e20 to about 5e20 ions/cm$^3$;
    growing a boron-doped germanium-free silicon layer having a boron concentration of about 1e20 to about 5e20 ions/cm$^3$ overlying the boron-doped SiGe layer; and
    forming a tensile strain region around the NFET gate structure.

2. The method of claim 1 wherein forming the tensile strain region around the NFET gate structure comprises selectively epitaxially growing an in situ phosphorus-doped (ISPD) silicon carbon (SiC) region.

3. The method of claim 1 wherein forming the tensile strain region around the NFET gate structure comprises growing a phosphorus-doped silicon carbon (SiC) layer having a carbon content of about 1% to about 3% and a phosphorus concentration of about 2e20 to about 6e20 ions/cm$^3$.

4. The method of claim 3 further comprising growing a phosphorus-doped carbon-free silicon layer having a phosphorus concentration of about 2e20 to about 6e20 ions/cm$^3$ overlying the phosphorus-doped SiC layer.

5. The method of claim 1 wherein forming the compressive and tensile strain regions comprises forming the strain regions with epitaxial facets.

6. The method of claim 1 further comprising replacing the temporary gate structures with high K metal gate (HKMG) structures.

7. The method of claim 1 wherein forming the PFET and NFET temporary gate structures on the substrate comprises:
    forming STI regions in the substrate;
    depositing a gate oxide layer over the substrate, a polysilicon layer over the gate oxide layer, and alternating oxide and nitride layers over the polysilicon layer;
    etching the gate oxide, polysilicon, and alternating oxide and nitride layers to form the temporary gate structures.

8. The method of claim 1 wherein performing a diffusionless annealing process on the active areas comprises performing an ultra fast anneal (UFA) process.

9. The method of claim 8 wherein performing the UFA process comprises annealing the active areas by laser spike anneal (LSA) or by flash lamp anneal (FLA) at a temperature of about 1200° C. to about 1300° C. and for a duration of about 1 ms to about 10 ms.

10. A method for fabricating an integrated circuit comprising:
    providing an ultrathin body fully depleted silicon-on-insulator substrate;
    forming a PFET temporary gate structure and an NFET temporary gate structure on the substrate;
    implanting ions to form lightly doped active areas around the gate structures;
    performing a diffusionless annealing process on the active areas;

forming a compressive strain region around the PFET gate structure;

forming a tensile strain region around the NFET gate structure by growing a phosphorus-doped silicon carbon (SiC) layer having a carbon content of about 1% to about 3% and a phosphorus concentration of about 2e20 to about 6e20 ions/cm$^3$; and growing a phosphorus-doped carbon-free silicon layer having a phosphorus concentration of about 2e20 to about 6e20 ions/cm$^3$ overlying the phosphorus-doped SiC layer.

11. The method of claim 10 wherein forming the compressive strain region around the PFET gate structure comprises selectively epitaxially growing an in situ boron-doped (ISBD) silicon germanium (SiGe) region.

12. The method of claim 10 wherein forming the compressive strain region around the PFET gate structure comprises growing a boron-doped silicon germanium (SiGe) layer having a germanium content of about 20% to about 30% and a boron concentration of about 1e20 to about 5e20 ions/cm$^3$.

13. The method of claim 10 wherein forming the compressive and tensile strain regions comprises forming the strain regions with epitaxial facets.

14. The method of claim 10 further comprising replacing the temporary gate structures with high K metal gate (HKMG) structures.

15. The method of claim 10 wherein forming the PFET and NFET temporary gate structures on the substrate comprises:

forming STI regions in the substrate;

depositing a gate oxide layer over the substrate, a polysilicon layer over the gate oxide layer, and alternating oxide and nitride layers over the polysilicon layer;

etching the gate oxide, polysilicon, and alternating oxide and nitride layers to form the temporary gate structures.

16. The method of claim 10 wherein performing a diffusionless annealing process on the active areas comprises performing an ultra fast anneal (UFA) process.

17. The method of claim 16 wherein performing the UFA process comprises annealing the active areas by laser spike anneal (LSA) or by flash lamp anneal (FLA) at a temperature of about 1200° C. to about 1300° C. and for a duration of about 1 ms to about 10 ms.

* * * * *